(12) United States Patent
Six

(10) Patent No.: US 10,107,943 B2
(45) Date of Patent: *Oct. 23, 2018

(54) OPTICAL IMAGING WITH REDUCED IMMERSION LIQUID EVAPORATION EFFECTS

(71) Applicant: Carl Zeiss SMT GmbH, Oberkochen (DE)

(72) Inventor: Stephan Six, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/582,863

(22) Filed: May 1, 2017

(65) Prior Publication Data

US 2017/0329055 A1    Nov. 16, 2017

Related U.S. Application Data

(63) Continuation of application No. 14/492,387, filed on Sep. 22, 2014, now Pat. No. 9,645,513, which is a
(Continued)

(30) Foreign Application Priority Data

May 7, 2009    (GB) .................................. 0907864.3

(51) Int. Cl.
*G03B 27/32*    (2006.01)
*G03B 27/52*    (2006.01)
(Continued)

(52) U.S. Cl.
CPC ............. *G02B 1/18* (2015.01); *G03F 7/7015* (2013.01); *G03F 7/70341* (2013.01); *G03F 7/70883* (2013.01)

(58) Field of Classification Search
CPC ........ G02B 21/00; G02B 21/02; G02B 21/33; G02B 27/0006; G03F 7/70;
(Continued)

(56) References Cited

U.S. PATENT DOCUMENTS 8,934,079 B2    1/2015 Six
9,645,513 B2    5/2017 Six
(Continued)

FOREIGN PATENT DOCUMENTS

CN    1683999 A    10/2005
EP    1 491 956    12/2004
(Continued)

OTHER PUBLICATIONS

The International Search Report and a Written Opinion from the counterpart PCT Application No. PCT/EP2010/056000 dated Aug. 10, 2010.
(Continued)

*Primary Examiner* — Colin Kreutzer
(74) *Attorney, Agent, or Firm* — Fish & Richardson P.C.

(57) ABSTRACT

The present disclosure relates to an optical arrangement for use in an optical imaging process. The optical arrangement includes an optical element, an immersion zone and a liquid repelling device. During the optical imaging process, the immersion zone is located adjacent to the optical element and is filled with an immersion liquid. The optical element has a first surface region and a second surface region. During the optical imaging process, the first surface region is wetted by the immersion liquid. At least temporarily during the optical imaging process, the liquid repelling device generates an electrical field in the region of the second surface. The electrical field being is adapted to cause a repellent force on parts of the immersion liquid which are responsive to the electrical field and inadvertently contact the second surface
(Continued)

region. The repellent force has a direction to drive away the parts of the immersion liquid from the second surface region.

21 Claims, 4 Drawing Sheets

Related U.S. Application Data continuation of application No. 13/285,729, filed on Oct. 31, 2011, now Pat. No. 8,934,079, which is a continuation of application No. PCT/EP2010/056000, filed on May 4, 2010.

(60) Provisional application No. 61/175,072, filed on May 4, 2009.

(51) Int. Cl.
  *G02B 1/18* (2015.01)
  *G03F 7/20* (2006.01)

(58) Field of Classification Search
  CPC ............. G03F 7/70341; G03F 7/70858; G03F 7/70883; G03F 7/70891; G03F 7/70916
  USPC ................. 355/30, 53, 72, 77; 359/656–661
  See application file for complete search history.

(56) References Cited

U.S. PATENT DOCUMENTS

| | | |
|---|---|---|
| 2005/0174549 A1 | 8/2005 | Duineveld et al. |
| 2006/0023187 A1 | 2/2006 | Eaton |
| 2006/0044640 A1 | 3/2006 | Kato et al. |
| 2006/0291060 A1 | 12/2006 | Shirai |
| 2007/0268468 A1 | 11/2007 | Coon et al. |
| 2012/0062865 A1 | 3/2012 | Six |
| 2014/0043592 A1 | 2/2014 | Shirai et al. |
| 2015/0009565 A1 | 1/2015 | Six |

FOREIGN PATENT DOCUMENTS

| | | |
|---|---|---|
| JP | 2008-235620 | 10/2008 |
| JP | 2009-038301 A | 2/2009 |
| WO | WO 02/28793 | 4/2002 |
| WO | WO 2005/020298 A1 | 3/2005 |
| WO | WO 2005/081067 | 9/2005 |
| WO | WO 2008/031576 | 3/2008 |
| WO | WO 2008/053918 | 5/2008 |

OTHER PUBLICATIONS

The International Preliminary Report on Patentability from the counterpart PCT Application No. PCT/EP2010/056000 dated Nov. 17, 2011.
Chinese Office Action, with translation thereof, for CN Appl No. 201080028972.1, dated Mar. 24, 2104.
Japanese Office Action, with translation thereof, for JP Appl No. 2014-036054, dated Jan. 6, 2015.

OPTICAL IMAGING WITH REDUCED IMMERSION LIQUID EVAPORATION EFFECTS

CROSS-REFERENCE TO RELATED APPLICATIONS

This application is a continuation of, and claims benefit under 35 USC 120 to, U.S. application Ser. No. 14/492,387, filed Sep. 22, 2014, now U.S. Pat. No. 9,645,513, which is a continuation of, and claims benefit under 35 USC 120 to, U.S. application Ser. No. 13/285,729, filed Oct. 31, 2011, now U.S. Pat. No. 8,934,079, which is a continuation of, and claims benefit under 35 USC 120 to, international application PCT/EP2010/056000, filed May 4, 2010, which claims benefit under 35 USC 119 of Great Britain Application No. 0907864.3, filed May 7, 2009 and under 35 USC 119(e) of U.S. Ser. No. 61/175,072, filed May 4, 2009. U.S. application Ser. Nos. 13/285,729, 14/492,387 and international application PCT/EP2010/056000 are hereby incorporated by reference in their entirety.

FIELD

The present disclosure relates to an optical imaging arrangement. The disclosure may be used in the context of microlithography used for fabricating microelectronic circuits. Thus, the present disclosure also relates to an optical imaging device which, among other things, may be implemented using such an optical imaging arrangement.

BACKGROUND

Especially in the area of microlithography, apart from the use of components having a high precision, it is desirable to keep the position and the geometry of the components of the imaging device, e.g. the optical elements such as lenses, mirrors and gratings, unchanged during operation to the highest possible extent in order to achieve a correspondingly high imaging quality. The demanding desired properties with respect to accuracy (lying in the magnitude of a few nanometers or below) are nonetheless a consequence of the permanent desire to reduce the resolution of the optical systems used in fabricating microelectronic circuitry in order to push forward miniaturization of the microelectronic circuitry to be produced.

In order to achieve an increased resolution either the wavelength of light used may be reduced as it is the case with systems working in the extreme UV (EUV) range at working wavelengths in the area of 5 nm to 20 nm (typically at about 13 nm) or the numerical aperture of the projection system used may be increased. One possibility to remarkably increase the numerical aperture above the value 1 is realized in so-called immersion systems, wherein an immersion medium having a refractive index larger than 1 is typically placed between the last optical element of the projection system and the substrate to be exposed. A further increase in the numerical aperture is possible with optical elements having a particularly high refractive index.

It will be appreciated that, in a so-called single immersion system, the immersion element (i.e. the optical element at least in part contacting the immersion medium in the immersed state) typically is the last optical element located closest to the substrate to be exposed. Here, the immersion medium typically contacts this last optical element and the substrate.

In a so-called double immersion system, the immersion element does not necessarily have to be the last optical element, i.e. the optical element located closest to the substrate. In such double or multiple immersion systems, and immersion element may also be separated from the substrate by one or more further optical elements. In this case, the immersion medium the immersion element is at least partly immersed in may be placed, for example, between two optical elements of the optical system.

With the reduction of the working wavelength as well as with the increase of the numerical aperture not only the desired properties with respect to the positioning accuracy and the dimensional accuracy of the optical elements used become more strict throughout the entire operation. Of course, the desired properties with respect to the minimization of imaging errors of the entire optical arrangement increase as well.

The deformations of the respective optical element and the imaging errors resulting therefrom are of special importance in this context. More specifically, it has turned out that evaporation effects of the immersion liquid contacting the optical element may introduce a considerable thermal disturbance into the optical element leading to relatively high local temperature gradients within the optical element. These high local temperature gradients resulting in considerable stresses introduced into the optical element which in turn will lead to increased imaging errors.

These evaporation effects are especially undesired at (ideally) dry areas of the immersion element which, under ideal conditions, should not be wetted by the immersion medium. However, since under real operating conditions the substrate to be exposed at certain points in time has to execute comparatively fast relative movements with respect to the immersion element, kinetic energy is transferred to the immersion medium leading to a certain sloshing movement of the immersion bath. This sloshing movement leads to an inadvertent wetting of these dry areas with parts of the immersion medium such as thin immersion liquid films or immersion liquid splashes etc. These typically randomly distributed and hardly predictable films or splashes are prone to easily evaporate leading to the undesired result on the imaging errors as outlined above.

To solve this problem it has been proposed to provide hydrophobic coatings at these dry areas of the immersion element to reduce the amount of immersion liquid which may contact the immersion element sufficiently long to evaporate and, thus, introduce a noticeable thermal disturbance into the immersion element. However, despite their hydrophobic properties, the use of such coatings has to rely on the gravitational force acting on the immersion liquid splashes or films to provide rapid removal of the immersion medium from the dry areas. Thus, particularly under unfavorable geometric conditions, these hydrophobic coatings may not be sufficient to provide rapid removal of the immersion medium prior to noticeable evaporation.

SUMMARY

The present disclosure provides an optical arrangement and an optical imaging device, respectively, which can exhibit improved properties, such as reduced immersion liquid evaporation effects and, consequently, improved imaging quality.

The present disclosure is based on the finding that an improved reduction of the effects of immersion liquid evaporation may be achieved by using an electrical field to which the immersion liquid is responsive in such a manner that a repellent force is exerted at least on the parts of the immersion liquid inadvertently contacting the (ideally) dry areas of the immersion element. Using the electrical field the repellent force may easily be adjusted to quickly drive the undesired parts of the immersion liquid away from the dry areas. In particular, this repellent force may be achieved irrespective of the spatial orientation of the dry area. Thus, even horizontally oriented dry areas may be easily cleared from such immersion liquid films or splashes. In other words, using the disclosure, clearance from such immersion liquid films or splashes may even be achieved under conditions where gravity based solutions typically do not provide the desired result.

It will be appreciated that gravity may assist the repellent force provided by the electrical field used according to the present disclosure. In other words, it is sufficient that the repellent force resulting from the electrical field triggers or induces, respectively, a motion of the immersion liquid parts to such an extent that further motion of the undesired immersion liquid parts away from the dry area is at least assisted or, beyond a certain point, predominantly or even fully provided by gravity.

The present disclosure provides an optical arrangement for use in an optical imaging process. The optical arrangement includes an optical element, an immersion zone and a liquid repelling device. During the optical imaging process, the immersion zone is located adjacent to the optical element and is filled with an immersion liquid. The optical element has a first surface region and a second surface region. During the optical imaging process, the first surface region is wetted by the immersion liquid. At least temporarily during the optical imaging process, the liquid repelling device generates an electrical field in the region of the second surface. The electrical field is adapted to cause a repellent force on parts of the immersion liquid being responsive to the electrical field and inadvertently contacting the second surface region. The repellent force has a direction to drive away the parts of the immersion liquid from the second surface region. Contact time between the second surface region and the parts of the immersion liquid is at least shortened leading to a reduction of the undesired evaporation effects as outlined above.

The present disclosure also provides an optical element for use in an optical imaging process. The optical arrangement includes an optical element body, a first surface region and a second surface region. The first surface region is adapted to be wetted by an immersion liquid responsive to an electrical field during the optical imaging process. At least one electrically conductive element is mechanically connected to the optical element body in the region of at least one of the first surface region and the second surface region. The at least one electrically conductive element is adapted to participate in generating the electrical field.

The present disclosure also provides an optical imaging device, in particular for microlithography, including an illumination device, a mask device for receiving a mask including a projection pattern, an optical projection device including an optical element group and a substrate device for receiving a substrate. The illumination device illuminates the projection pattern while the optical element group projects the projection pattern onto the substrate. The optical projection device further includes an optical arrangement according to the present disclosure.

The present disclosure also provides a method of reducing liquid evaporation effects at a surface of an optical element during an optical imaging process. The method includes providing the optical element and an immersion liquid. The optical element has a first surface region and a second surface region. During the optical imaging process, the first surface region is wetted by the immersion liquid. At least temporarily during the optical imaging process, an electrical field is generated in the region of the second surface. The electrical field causes a repellent force on parts of the immersion liquid being responsive to the electrical field and inadvertently contacting the second surface region. The repellent force has a direction to drive away the parts of the immersion liquid from the second surface region.

Further features and preferred embodiments of the disclosure become apparent from the dependent claims and the following description of preferred embodiments given with reference to the appended drawings, respectively. All combinations of the features disclosed, whether explicitly recited in the claims or not, are within the scope of the disclosure.

DETAILED DESCRIPTION

First Embodiment

In the following, a first preferred embodiment of the optical imaging device according to the disclosure including a preferred embodiment of the optical arrangement according to the disclosure will be described with reference to the FIGS. 1 to 3.

Figure 1:
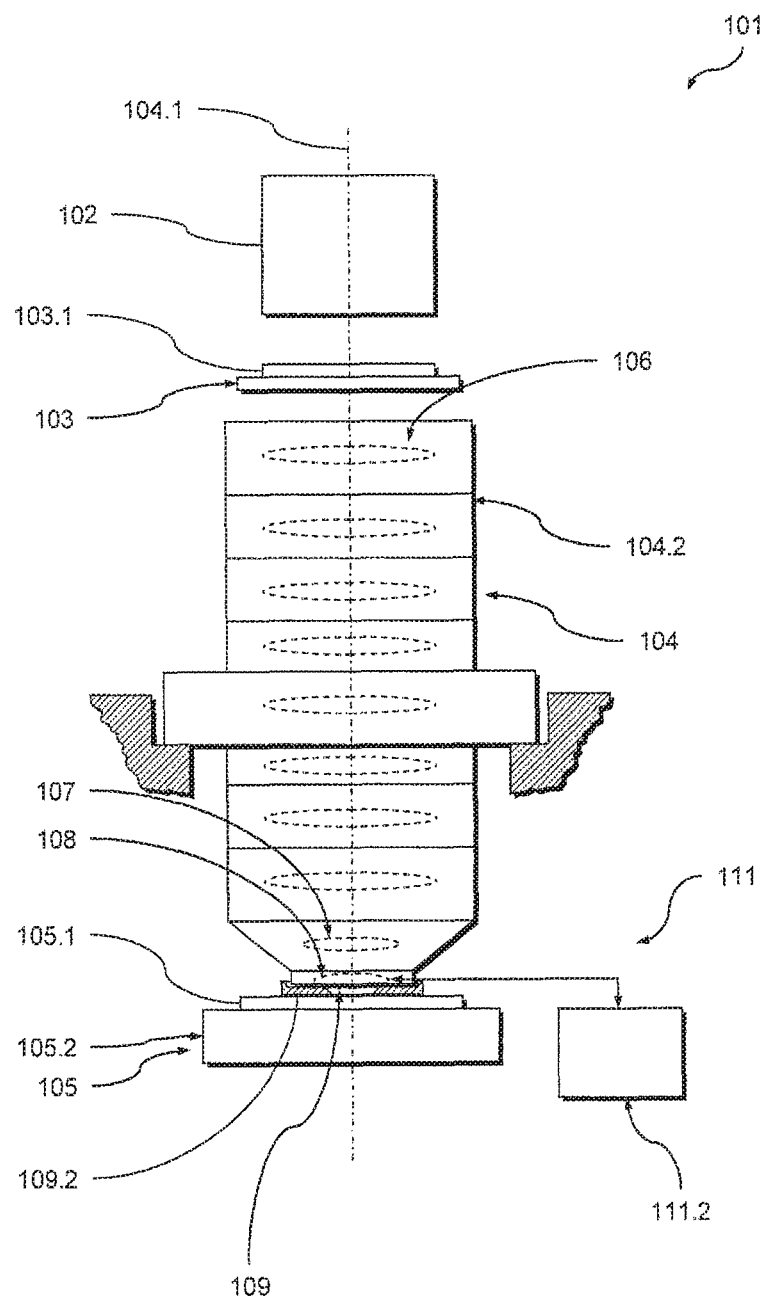
FIG. 1 is a schematic representation of a preferred embodiment of the optical imaging device according to the disclosure using which the preferred embodiment of the method of reducing liquid evaporation effects at a surface of an optical element according to the disclosure may be executed.

FIG. 1 is a schematic representation of a preferred embodiment of the optical imaging device according to the disclosure in the form of a microlithography device 101 operating with light in the UV range having a wavelength of 193 nm.

The microlithography device 101 includes an illumination system 102, a mask device with a mask table 103, an optical projection system in the form of an objective 104 having an optical axis 104.1 and a substrate device 105. In an exposure or optical imaging process performed with the microlithography device 101 the illumination system 102 illuminates a mask 103.1 arranged on the mask table 103 with a projection light beam (not shown in further detail) having a wavelength of 193 nm. A projection pattern is formed on the mask 103.1 which is projected by the projection light beam via the optical elements arranged within the objective 104 onto a substrate in the form of a wafer 105.1 arranged on a wafer table 105.2 of the substrate device 105.

The objective 104 includes an optical element group 106 formed by a series of optical elements 107, 108. The optical elements 107, 108 are held within the housing 104.2 of the objective 104. Due to the working wavelength of 193 nm the optical elements 107, 108 are refractive optical elements such as lenses or the like. The last optical element 108 located closest to the wafer 105.1 during the optical imaging process is a so called closing element or last lens element.

The microlithography device 101 is an immersion system. Thus, in an immersion zone 109, a liquid immersion medium 109.1, for example highly purified water or the like, is arranged between the wafer 105.1 and the last lens element 109. Within the immersion zone 109 there is provided an immersion bath of the immersion medium 109.1 on the one hand downwardly delimited at least by the part of the wafer 105.1 to be actually exposed. The lateral limitation on the immersion bath is provided at least partially by an immersion frame 109.2 (typically also called an immersion hood). At least the part of the last lens element 108 optically used during exposure and lying on the outer side of the objective 104 is immersed in the immersion bath such that the last lens element 108 is an immersion element in the sense of the present disclosure. Thus, the path of the light exiting from the last lens element 108 between the last lens element 108 and the wafer 105.1 is located exclusively within the immersion medium 109.1.

Because the refractive index of the immersion medium 109.1 is greater than one, a numerical aperture NA>1 is achieved and the resolution is enhanced with respect to a conventional system with a gas atmosphere between the last lens element and the wafer. FIG. 2, in a schematic partial sectional view of a part of the microlithography device 101 in the region of the immersion element 108, shows a preferred embodiment of the optical arrangement 110 according to the disclosure. As can be seen best from FIG. 2, the immersion element 108 (forming part of the optical arrangement 110) has a first surface region 108.1 which is contacted and, thus, wetted by the immersion liquid 109.1 (also forming part of the optical arrangement 110) during the optical imaging process. Consequently, in the following, this first surface region 108.1 is also called the wet surface region of the immersion element 108.

Furthermore, the immersion element 108 has a second surface region 108.2 which is located adjacent to the first surface region 108.1 and, under ideal or static conditions during the optical imaging process, should not be contacted by the immersion bath. Consequently, in the following, this second surface region 108.2 is also called a (ideally) dry surface region of the immersion element.

However, since under real operating conditions of the microlithography device 101, the wafer 105.1 to be exposed at certain points in time has to execute comparatively fast relative movements with respect to the immersion element 108 (in the x- and y-direction), kinetic energy is transferred to the immersion medium 109.1 leading to a certain sloshing movement of the immersion bath. This sloshing movement leads to an inadvertent wetting of the dry surface region 108.2 with parts of the immersion medium such as thin immersion liquid films, immersion liquid splashes or immersion liquid drops etc. as it is indicated in an exemplary way by the immersion liquid drop 109.3 in FIG. 2. These typically randomly distributed and hardly predictable films or splashes are prone to easily evaporate leading to high local temperature gradients within the immersion element 108 and, consequently, to the undesired effect of increasing the imaging errors introduced into the imaging process via the immersion element 108 as has been outlined in detail above.

In order to at least reduce these evaporation effects the optical arrangement 111 includes a liquid repelling device 111. The liquid repelling device 111 serves to exert a repellent force F on the parts of the immersion liquid 109.1 inadvertently contacting the dry surface region 108.2 such as, for example, the immersion liquid drop 109.3. As can be seen from FIG. 2, this repellent force F has a direction which helps to quickly drive the drop 109.3 inadvertently contacting the dry surface region 108.2 away from the dry surface region 108.2. By this approach, the contact time between the dry surface region 108.2 and the drop 109.3 is at least shortened leading to a reduced local cooling of the immersion element 108 (caused by the evaporation of parts of the drop 109.3 or even the entire drop 109.3).

Figure 2:
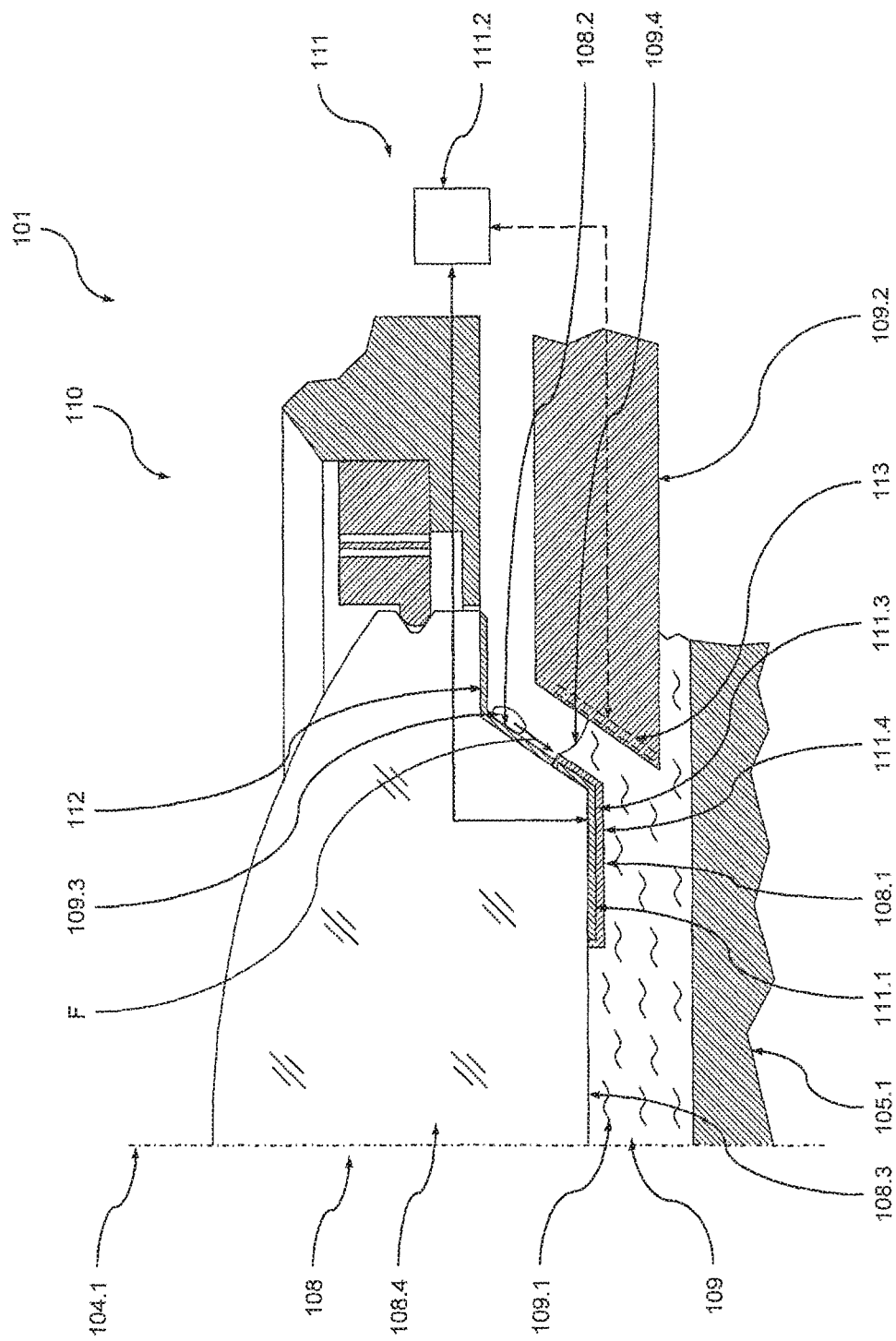
FIG. 2 is a schematic partial section of a part of the imaging device of FIG. 1.

The liquid repellent device 111, in the embodiment shown in FIG. 2, achieves this repellent force F via a field generating element in the form of an electrically conductive element 111.1 located in the wet surface region 108.1. The electrically conductive element 111.1 is formed by a layer of a coating formed on the outer surface 108.3 of the optical element body 108.4 of the immersion element 108. The coating 111.1 is made of an electrically conductive material including (exclusively or in an arbitrary combination) chromium (Cr), aluminium (Al), titanium (Ti), hafnium (Hf), nickel (Ni) or any other electrically conductive material which is approved for use in the specific optical imaging application performed with the device 101 (i.e. here: any other electrically conductive material which is approved for use in microlithography applications).

The electrically conductive element 111.1 generates a first electrical field E1 to which the immersion liquid 109.1 is responsive leading to the repellent force F acting on the drop 109.3. In the embodiment shown, the electrical field E1 is generated by electrostatically charging the electrically conductive element 111.1. This is done via a first field generating device 111.2 that temporarily electrically contacts the electrically conductive element 111.1 in order to provide the electrostatic charge at the electrically conductive element 111.1.

The polarity of the electrostatic charge at the electrically conductive element 111.1 depends on the immersion liquid and the repellent force F to be exerted on the drop 109.3. In the embodiment shown in FIG. 2, with the electrically conductive element 111.1 being arranged in the wet surface region 108.1, the repellent force F is provided by an attractive force acting between the drop 109.3 and the electrically conductive element 111.1 and provoked by the electrostatic charge of the electrically conductive element 111.1.

In the embodiment shown in FIG. 2, the electrically conductive element 111.1 is provided with a negative (or positive) electrical charge such that the desired repellent force F is achieved in the interaction between the inhomogeneous electrostatic field (showing a field gradient between 100 V/m$^2$ and 10000 V/m$^2$, preferably between 500 V/m$^2$ and 5000 V/m$^2$) produced by the electrically charged element 111.1 and the immersion liquid 109.1 which is electrically polarized by the electrostatic field of the electrically charged element 111.1 (i.e. shows an orientation of the electrical dipoles in the highly purified water used as the immersion liquid 109.1 as a result of the field produced by the electrically charged element 111.1).

In this context the following basic considerations apply. An immersion liquid droplet 109.3 sitting on the dry surface region 108.2 and having a radius r=2 mm is subject to attraction forces A (due to its prevailing surface energy SE of about 80·10$^{-3}$ N/m resulting from its the surface tension and the interaction with the surface of the surface region 108.2) lying in the order of magnitude of 1 mN according to the equation:

$$A = 2 \cdot \pi \cdot r \cdot SE = 2 \cdot \pi \cdot (2 \cdot 10^{-3} m) \cdot \left(80 \cdot 10^{-3} \frac{N}{m}\right) \approx 1 \cdot 10^{-3} N \quad (1)$$

The static frictional forces to be overcome lie in the order of magnitude of 1 mN to $1 \cdot 10^{-3}$ mN.

A point-shaped electric charge Q generates an electrical field E at a distance d according to the following equation:

$$E = \frac{Q}{4 \cdot \pi \cdot \varepsilon_0} \cdot \frac{1}{r^2}, \quad (2)$$

wherein $\varepsilon_0 = 8.85 \cdot 10^{-12}$ C/(V·m) is the electric constant (also referred to as vacuum permittivity). Accordingly, the electric field gradient dE/dr is calculated according to the following equation:

$$\frac{dE}{dr} = \frac{Q}{2 \cdot \pi \cdot \varepsilon_0} \cdot \frac{1}{r^3}. \quad (3)$$

In a rough approximation, a water droplet in an electric field E undergoes an electric polarization P according to the following equation:

$$P = \varepsilon_0 \cdot (\varepsilon_r - 1) \cdot E, \quad (4)$$

wherein $\varepsilon_r$ is the relative static permittivity (also referred to as dielectric constant). Thus, with a relative static permittivity $\varepsilon_r = 80$ for a water droplet, using equations (2) to (4) the force on such a electrically polarized water droplet is calculated according to the following equation:

$$F = P \cdot \frac{dE}{dr} = \frac{Q^2 \cdot (\varepsilon_r - 1)}{8 \cdot \pi \cdot \varepsilon_0 \cdot r^5}. \quad (5)$$

Thus, a point-shaped electric charge of Q=1 nC (=1.9·10$^{10}$ e, with e being the elementary charge), at a distance d=0.1 m, provokes an electric field E=900 V/m and an electric field gradient dE/dr=1.8·10$^4$ V/m$^2$. Thus, the water droplet, in a first approximation, undergoes a dipole moment of 6.3·10$^{-7}$ Cm. The resulting force exerted on the water droplet is thus F=11·10$^{-3}$N. Thus, it is preferred to have a field gradient between 100 V/m$^2$ and 10000 V/m$^2$, preferably between 500 V/m$^2$ and 5000 V/m$^2$.

However, it will be appreciated that, with other embodiments of the disclosure, the immersion medium itself may be provided with a corresponding electrical charge (by a suitable mechanism) in order to achieve the desired repellent force F. Apparently, the electrical charge of the electrically conductive element is then selected as a function of the electrical charge of the immersion medium (and vice versa).

In this context the following basic considerations apply. In an electrically charged immersion medium the force F acting on the droplet having an electric charge Q in an electric field E is calculated according to the following equation:

$$F = E \cdot Q. \quad (6)$$

Thus, in order to achieve a force F=1·10$^{-3}$N in an electric field E=1·10$^3$ V/m, an electric charge of Q=1·10$^{-6}$ C is used.

It will be appreciated that the electrical charge of the electrically conductive element 111.1 may be provided only once provided that no substantial loss in the charge is to be expected over the lifetime of the system. However, as shown in FIG. 2, the field generating device 111.2 is adapted to electrically contact the electrically conductive element 111.1 from time to time (e.g. between the exposure of different wafers 105.1) in order to maintain the electrostatic charge at the electrically conductive element 111.1 at the desired level.

In order to prevent discharge of the electrically conductive element 111.1 an electrically insulating element 111.3 is provided on the third surface region 111.4 of the electrically conductive element 111.1 facing the immersion liquid 109.1. The electrically insulating element 111.3 may be formed from any suitable electrically insulating material which is approved for use in the specific optical imaging application performed with the device 101 (i.e. here: any other electrically insulating material which is approved for use in microlithography applications).

The electrically insulating element 111.3 is formed by a layer of a coating formed on the outer surface 111.4 of the electrically conductive element 111.1. The coating 111.3 is made of an electrically insulating material including (exclusively or in an arbitrary combination) silicon dioxide ($SiO_2$), aluminum oxide ($Al_2O_3$), hafnium oxide ($HfO_2$), tantalum pentoxide ($Ta_2O_5$) or any other suitable electrically insulating material.

It will be appreciated that the silicon dioxide ($SiO_2$) also has the advantage that it is a hydrophilic material leading to good wetting properties at the wet surface region 108.1. However, it will be appreciated that, with other embodiments of the disclosure, a combination of at least one electrically insulating layer and at least one hydrophilic layer may be chosen for the electrically insulating element.

It will be further appreciated that, with other embodiments of the disclosure, the electrically conductive element may also be fully embedded in such an electrically insulating element in order to prevent discharge to the largest possible extent.

The electrically conductive element 111.1 ends in the region where the free surface 109.4 of the immersion bath is ideally located, i.e. at the transition between the wet surface region 108.1 and the dry surface region 108.2. Thus, a good assistance of the removal of the immersion liquid parts from the dry surface region 108.2 by the repellent force F is achieved.

As can be seen from FIG. 2, in the embodiment shown, the optical element body 108.4 is further provided with a hydrophobic coating 112 in the dry surface region 108.2 further promoting removal of the inadvertent immersion liquid parts from the dry surface region 108.2. However, with other embodiments of the disclosure, such a hydrophobic coating may also be omitted.

It will be appreciated that, with other embodiments of the disclosure, instead or in addition to the electrically conductive element 111.1 an electrically conductive element (generating or contributing to the electric field provoking the repellent force F) may also be provided at a location other than the immersion element, e.g. at the immersion frame 109.2 as it is indicated by the dashed contour 113 in FIG. 2. The implementation and principle of operation of such an electrically conductive element 113 is identical to the one of the electrically conductive element 111.1 such that it is here only referred to the explanations given above.

It will be appreciated that, with other embodiments of the disclosure, instead of a single electrically conductive element 111.1 a plurality of electrically conductive elements may be used in the liquid repelling device. Furthermore, different sizes and/or shapes and/or materials (in a virtually arbitrary combination) may be chosen for these electrically conductive elements depending, in particular, on the electrical field to be generated.

It will be further appreciated that the repellent force F may be achieved irrespective of the spatial orientation of the dry surface region 108.2. Thus, even horizontally oriented dry surface regions may be easily cleared from such immersion liquid drops 109.3. In other words, using the disclosure, clearance from such immersion liquid films, splashes or drops may even be achieved under conditions where gravity based solutions typically do not provide the desired result.

It will be further appreciated that gravity may assist the repellent force F provided by the liquid repelling device 110 according to the present disclosure. In other words, it is sufficient that the repellent force F triggers or induces, respectively, a motion of the immersion liquid parts 109.3 to such an extent that further motion of the undesired immersion liquid parts 109.3 away from the dry surface region 108.2 is at least assisted or, beyond a certain point, predominantly or even fully provided by gravity.

It will be further appreciated that, in addition to promoting removal of the drop 109.3 from the dry surface, the liquid repelling device 111, due to the repellent force F generated, also helps to prevent formation of such immersion liquid parts at the dry surface region as a result of the sloshing movement of the immersion liquid.

Figure 3:
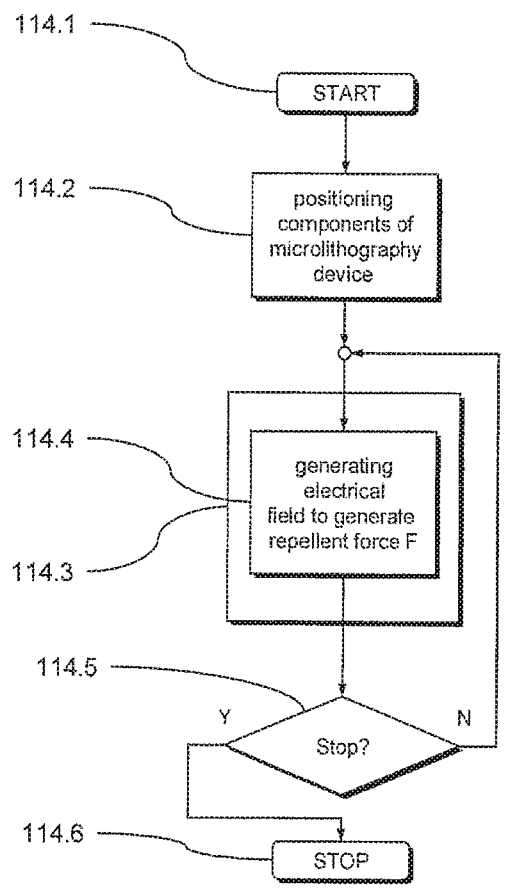
FIG. 3 is a block diagram of a preferred embodiment of the method of reducing liquid evaporation effects at a surface of an optical element according to the disclosure which may be executed with the optical imaging device of FIG. 1.

FIG. 3 shows a block diagram of a preferred embodiment of an optical imaging method which may be executed with the microlithography device 101 and includes a method of reducing liquid evaporation effects at a surface of an optical element during an optical imaging process according to the disclosure.

First, in a step 114.1 execution of the method starts. In a step 114.2 the components of the microlithography device 101 are mutually positioned with respect to each other such that the configuration described above is achieved.

In a step 114.3 at least a part of the projection pattern on the mask 103.1 is projected onto the wafer 105.1 in the manner as it has been described above. In a step 114.3, in parallel to this projection, the liquid repellent force F is generated by the liquid repelling device 111 as it has been described above.

In a step 114.5 it is checked if execution of the method is to be stopped. If this is the case, execution of the method is stopped in a step 114.6. Otherwise it is jumped back to step 114.3.

Second Embodiment

In the following a second preferred embodiment of an optical arrangement 210 according to the disclosure will be described with reference to FIGS. 1, 3 and 4. The optical arrangement 210 may replace the optical arrangement 110 in the microlithography device 101 of FIG. 1. The optical arrangement 210 in its basic design and functionality largely corresponds to the optical arrangement 110 such that it will be mainly referred to the differences only. In particular, similar components are given the same reference numerals raised by the amount 100. In case nothing else is stated in the following with respect to the properties of such components it is here referred to the explanations given above.

Figure 4:
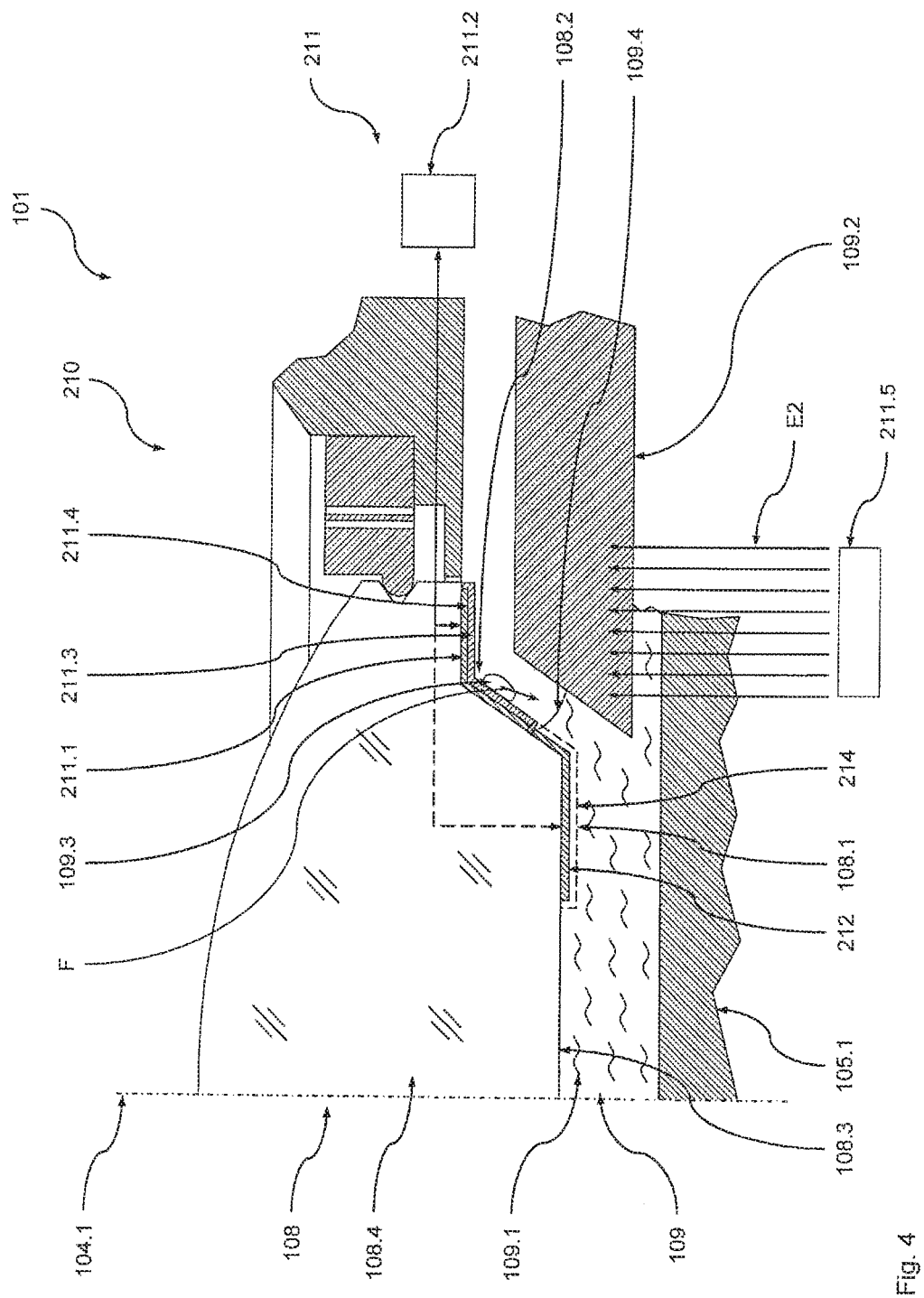
FIG. 4 is a schematic partial section of a part of a further preferred embodiment of the optical imaging device according to the disclosure.

FIG. 4, in a schematic partial sectional view similar to FIG. 2, shows the optical arrangement 210. As can be seen best from FIG. 4, the immersion element 108 (forming part of the optical arrangement 210) again has a wet first surface region 108.1 which is contacted and, thus, wetted by the immersion liquid 109.1 (also forming part of the optical arrangement 210) during the optical imaging process. Furthermore, the immersion element 108 again has a dry second surface region 108.2 which is located adjacent to the first surface region 108.1 and, under ideal or static conditions during the optical imaging process, should not be contacted by the immersion bath.

In order to at least reduce the evaporation effects of immersion liquid films, immersion liquid splashes or immersion liquid drops 109.3 the optical arrangement 211 includes a liquid repelling device 211. The liquid repelling device 211 serves to exert a repellent force F on the parts of the immersion liquid 109.1 inadvertently contacting the dry surface region 108.2 such as, for example, the immersion liquid drop 109.3. As can be seen from FIG. 3, this repellent force F has a direction which helps to quickly drive the drop 109.3 inadvertently contacting the dry surface region 108.2 away from the dry surface region 108.2. By this approach, the contact time between the dry surface region 108.2 and the drop 109.3 is at least shortened leading to a reduced local cooling of the immersion element 108 (caused by the evaporation of parts of the drop 109.3 or even the entire drop 109.3).

The liquid repellent device 211, in the embodiment shown in FIG. 4, achieves this repellent force F via a field generating element in the form of an electrically conductive element 211.1 located in the dry surface region 108.2. The electrically conductive element 211.1 is formed by a layer of a coating formed on the outer surface 108.3 of the optical element body 108.4 of the immersion element 108. The coating 211.1 is made of an electrically conductive material including (exclusively or in an arbitrary combination) chromium (Cr), aluminium (Al), hafnium (Hf), titanium (Ti), nickel (Ni) or any other electrically conductive material which is approved for use in the specific optical imaging application performed with the device 101 (i.e. here: any other electrically conductive material which is approved for use in microlithography applications).

The electrically conductive element 211.1 generates a first electrical field E1 to which the immersion liquid 109.1 is responsive leading to the repellent force F acting on the drop 109.3. In the embodiment shown, the electrical field E1 is generated by electrostatically charging the electrically conductive element 211.1. This is done via a first field generating device 211.2 that temporarily electrically contacts the electrically conductive element 211.1 in order to provide the electrostatic charge at the electrically conductive element 211.1.

The polarity of the electrostatic charge at the electrically conductive element 211.1 depends on the immersion liquid and the repellent force F to be exerted on the drop 109.3. In the embodiment shown in FIG. 4, with the electrically conductive element 211.1 being arranged in the dry surface region 108.2, the repellent force F is provided by a repulsive force acting between the drop 109.3 and the electrically conductive element 211.1 and provoked by the electrostatic charge of the electrically conductive element 211.1.

In the embodiment shown in FIG. 4, the electrically conductive element 211.1 is provided with a negative (or positive) electrical charge such that the desired repellent force F is achieved in the interaction with an electrical polarity of the immersion liquid 109.1 formed by an orientation of the electrical dipoles in the highly purified water used as the immersion liquid 109.1. This polarity in the immersion liquid 109.1 is achieved via a second electrical field E2 generated by a further, second field generating device 211.5 of the liquid repelling device 211.

However, it will be appreciated that, with other embodiments of the disclosure, the immersion medium itself may be provided with a corresponding electrical charge (by a suitable mechanism) in order to achieve the desired repellent force F. Apparently, the electrical charge of the electrically conductive element is then selected as a function of the electrical charge of the immersion medium (and vice versa).

It will be appreciated that the electrical charge of the electrically conductive element 211.1 may be provided only once provided that no substantial loss in the charge is to be expected over the lifetime of the system. However, as shown in FIG. 3, the field generating device 211.2 is adapted to electrically contact the electrically conductive element 211.1 from time to time (e.g. between the exposure of different wafers 105.1) in order to maintain the electrostatic charge at the electrically conductive element 211.1 at the desired level.

In order to prevent discharge of the electrically conductive element 211.1 an electrically insulating element 211.3 is provided on the third surface region 211.4 of the electrically conductive element 211.1 facing the immersion liquid 109.1. The electrically insulating element 211.3 may be formed from any suitable electrically insulating material which is approved for use in the specific optical imaging application performed with the device 101 (i.e. here: any other electrically insulating material which is approved for use in microlithography applications).

The electrically insulating element 211.3 is formed by a layer of a coating formed on the outer surface 211.4 of the electrically conductive element 211.1. The coating 211.3 is made of an electrically insulating material including (exclusively or in an arbitrary combination) a hydrophobic material like diamond-like-carbon (DLC) or Teflon-like material or of hydrophilic material like $SiO_2$, $Al_2O_3$ or $Ta_2O_5$ or any other suitable electrically insulating material ultimately covered with an additional hydrophobic material.

It will be appreciated that the electrically insulating material preferably is a hydrophobic material leading to good liquid removal properties at the dry surface region 108.2. However, it will be appreciated that, with other embodiments of the disclosure, a combination of at least one electrically insulating layer and at least one hydrophobic layer may be chosen for the electrically insulating element.

It will be further appreciated that, with other embodiments of the disclosure, the electrically conductive element may also be fully embedded in such an electrically insulating element in order to prevent discharge to the largest possible extent.

The electrically conductive element 211.1 ends in the region where the free surface 109.4 of the immersion bath is ideally located, i.e. at the transition between the wet surface region 108.1 and the dry surface region 108.2. Thus, a good assistance of the removal of the immersion liquid parts from the dry surface region 108.2 by the repellent force F is achieved.

As can be seen from FIG. 4, in the embodiment shown, the optical element body 108.4 is further provided with a hydrophilic coating 212 in the wet surface region 108.1 promoting good wetting of the wet surface 108.1. However, with other embodiments of the disclosure, such a hydrophilic coating may also be omitted.

It will be appreciated that, with other embodiments of the disclosure, instead or in addition to the electrically conductive element 211.1 an electrically conductive element (generating or contributing to the electric field provoking the repellent force F) as it has been described in the context of the first embodiment may also be provided as it is indicated by the dashed contour 214 in FIG. 4. The implementation and principle of operation of such an electrically conductive element 214 is identical to the one of the electrically conductive element 111.1 such that it is here only referred to the explanations given above.

It will be appreciated that, with other embodiments of the disclosure, instead of a single electrically conductive element 211.1 a plurality of electrically conductive elements may be used in the liquid repelling device. Furthermore, different sizes and/or shapes and/or materials (in a virtually arbitrary combination) may be chosen for these electrically conductive elements depending, in particular, on the electrical field to be generated.

It will be further appreciated that the repellent force F may be achieved irrespective of the spatial orientation of the dry surface region 108.2. Thus, even horizontally oriented dry surface regions may be easily cleared from such immersion liquid drops 109.3. In other words, using the disclosure, clearance from such immersion liquid films, splashes or drops may even be achieved under conditions where gravity based solutions typically do not provide the desired result.

It will be further appreciated that gravity may assist the repellent force F provided by the liquid repelling device 210 according to the present disclosure. In other words, it is sufficient that the repellent force F triggers or induces, respectively, a motion of the immersion liquid parts 109.3 to such an extent that further motion of the undesired immersion liquid parts 109.3 away from the dry surface region 108.2 is at least assisted or, beyond a certain point, predominantly or even fully provided by gravity.

It will be appreciated that the methods described above with reference to FIG. 3 may also be executed with the second embodiment such that it is here only referred to the explanations given above.

In the foregoing, the present disclosure has been described via examples where the electrical field provoking the repellent force is an electrostatic field. However, it will be appreciated that the disclosure may also be implemented using electrodynamic fields to which the immersion liquid is responsive generating the desired repellent force F.

In the foregoing, the present disclosure has been described via examples wherein the optical element group consists of refractive optical elements exclusively. However, it is to be mentioned here that the disclosure, in particular in the case of performing the imaging process at different wavelengths, may of course be used with optical element groups that include, alone or in an arbitrary combination, refractive, reflective or diffractive optical elements.

Furthermore, it is to be mentioned that, in the foregoing, the present disclosure has been described via an example in the area of microlithography. However, it will be appreciated that the present disclosure may also be used for any other application and imaging process, respectively.

What is claimed is:

1. An optical arrangement having an immersion zone, the optical arrangement comprising:
   an optical element having a first and second surface regions,
   wherein:
      the first surface region comprises a hydrophilic surface part;
      the second surface region comprises a hydrophobic surface part adjacent the hydrophilic surface part;
      during use of the optical arrangement in an optical imaging process:
         the immersion zone is located adjacent to the optical element;

the immersion zone is filled with an immersion liquid; and the first surface region is immersed in the immersion liquid;

at least one member selected from the group consisting of the hydrophilic surface part and the hydrophobic surface part comprises a coating of the optical element;

the optical arrangement further comprises an electrically conductive element between the coating and an optical element body of the optical element; and the electrically conductive element is configured to participate in generating an electrical field.

2. The optical arrangement according to claim 1, wherein the hydrophilic surface part comprises the hydrophilic coating of the optical element.

3. The optical arrangement according to claim 1, wherein the hydrophobic surface part comprises the hydrophobic coating of the optical element.

4. The optical arrangement according to claim 1, wherein, during use of the optical arrangement in an optical imaging process, the hydrophilic surface part is immersed in the immersion liquid while the hydrophobic surface part is not immersed in the immersion liquid.

5. The optical arrangement according to claim 1, wherein the coating comprises a multi-layer coating.

6. The optical arrangement according to claim 1, wherein the electrical field is an electrostatic field.

7. The optical arrangement according to claim 1, wherein the electrically conductive element is located in the region of the first surface region, and the electrical field is configured so that an attractive force acts between parts of the immersion liquid inadvertently contacting the second surface region and the electrically conductive element.

8. The optical arrangement according to claim 1, wherein the electrically conductive element is located in the region of the second surface region, and the electrical field is configured so that a repulsive force acts between parts of the immersion liquid inadvertently contacting the second surface region and the electrically conductive element.

9. The optical arrangement according to claim 1, further comprising an electrical field generating device, wherein the electrical field generating device at least temporarily electrically contacts the electrically conductive element to generate the electrical field.

10. The optical arrangement according to claim 1, wherein the optical imaging process is a micro-lithography process.

11. An optical element, comprising:

a hydrophilic surface part and an adjacent hydrophobic surface part; and a further surface part different from both the hydrophobic surface part and the hydrophilic surface part, wherein the hydrophilic surface part is configured to be immersed in an immersion liquid during use of the optical element in an optical imaging process, and the further surface part comprises an optically used surface part configured to be optically used when the optical element is used in the optical imaging process.

12. The optical element according to claim 11, wherein the hydrophilic surface part comprises a hydrophilic coating of the optical element.

13. The optical element according to claim 11, wherein the hydrophobic surface part comprises a hydrophobic coating of the optical element.

14. The optical element according to claim 11, wherein, during use of the optical element in an optical imaging process, the hydrophilic surface part is immersed in an immersion liquid while the hydrophobic surface part is not immersed in the immersion liquid.

15. The optical element according to claim 11, wherein at least one member selected from the group consisting of the hydrophilic surface part and the hydrophobic surface part comprises a coating of the optical element.

16. The optical element according to claim 15, wherein the coating comprises a multi-layer coating of the optical element.

17. The optical element according to claim 15, further comprising an electrically conductive element is located between the coating and an optical element body of the optical element.

18. The optical element according to claim 17, wherein the electrically conductive element is electrically charged to generate an electrostatic field.

19. An optical imaging device, comprising:

an illumination device configured to illuminate a pattern of a mask; and an optical projection device configured to project the projection pattern onto a substrate, wherein the optical projection device comprises an optical element group, and the optical element group comprises an optical element according to claim 11.

20. A method, comprising:

providing the optical element according to claim 11 and an immersion liquid; and at least temporarily immersing part of the optical element in the immersion liquid during the optical imaging process.

21. The method of claim 20, wherein the method comprises an optical imaging method.

* * * * *